United States Patent [19]

Winterer

[11] Patent Number: 5,057,796
[45] Date of Patent: Oct. 15, 1991

[54] DIGITAL FREQUENCY MODULATION SYSTEM IN WHICH HIGH AND LOW FREQUENCY PORTIONS ARE PROCESSED SEPARATELY

[75] Inventor: Martin Winterer, Gundelfingen, Fed. Rep. of Germany

[73] Assignee: Deutsche ITT Industries GmbH, Freiburg, Fed. Rep. of Germany

[21] Appl. No.: 610,634

[22] Filed: Nov. 8, 1990

[30] Foreign Application Priority Data

Nov. 18, 1989 [EP] European Pat. Off. ............ 89121402

[51] Int. Cl.$^5$ ......................... H03C 3/00; H04N 5/92
[52] U.S. Cl. .................................... 332/119; 332/123; 358/330; 358/23; 360/30; 375/44; 455/43; 455/110
[58] Field of Search ............... 332/117, 119, 120, 123, 332/144, 145; 375/44, 60; 455/42, 43, 102, 110; 358/23, 330; 360/29, 30

[56] References Cited

U.S. PATENT DOCUMENTS

| | | |
|---|---|---|
| 3,654,450 | 4/1972 | Webb .................................. 235/197 |
| 3,778,718 | 12/1973 | Bass et al. ........................ 332/120 X |
| 3,868,599 | 2/1975 | Hirasaki et al. ..................... 332/120 |
| 4,802,016 | 1/1989 | Kaneko ................................. 358/315 |

FOREIGN PATENT DOCUMENTS 0068535 6/1982 European Pat. Off. .

OTHER PUBLICATIONS

Digitale Signalverarbeitung; Elektronik; Printed in Germany, 1984 pp. 97-100.

Primary Examiner—Siegfried H. Grimm
Attorney, Agent, or Firm—Thomas L. Peterson

[57] ABSTRACT

In a frequency modulation system, a modulating signal is split into its low-frequency and high-frequency components. The low frequency component is used to modulate a carrier signal by conventional means in a first circuit and the low- and high-frequency components are used to narrowband modulate the carrier signal in a second circuit. The outputs of the first and second circuits are combined to provide a frequency modulated signal. The modulating and carrier signals can be binary-coded signals.

23 Claims, 2 Drawing Sheets

DIGITAL FREQUENCY MODULATION SYSTEM IN WHICH HIGH AND LOW FREQUENCY PORTIONS ARE PROCESSED SEPARATELY

BACKGROUND OF THE INVENTION

The present invention relates in general to frequency modulation systems, and in particular to a digital frequency modulation system in which the low frequency component of a modulating signal is subjected to conventional frequency modulation and the high frequency component of the modulating signal is subjected to narrow-band frequency modulation.

Increases in the speed of integrated circuits have contributed to the rapid development of videotape recorders. Integrated circuits now operate at speeds that allow for video signals to be digitized. A composite video signal, which, contains information on luminance, is digitized and then stored on a magnetic tape by the videotape recorder. For instance, the red, green and blue components of the composite signal are stored on separate tracks of the magnetic tape. Since the video signal is amplitude modulated, however, each component of the composite signal must first be frequency modulated before being stored on the magnetic tape.

A conventional modulator system is disclosed in an article entitled "Digitalisierung der Video-Singalverarbeitung Beispiel: Video-Kassettenrecorder" by Peter Draheim in the German publication Elektronik-Sonderheft, No. 57, 1984 on pp. 97–100. A first adder adds a modulating signal to a carrier signal for output to an integrator. The integrator contains a second adder, a memory element and a feedback path, which couples the output of the memory element to a first input of the second adder. The output of the first adder is coupled to a second input of the second adder. The output of the memory element, which also provides the output of the integrator, is applied to a sine lookup table, whose output provides a frequency modulated signal.

During conventional frequency modulation, the frequency of the modulating signal must fall within the band $f_c \pm \Delta f$, where fc is the carrier frequency and $\Delta f$ is the frequency deviation. If the modulating signal contains high frequency components as compared to the sampling frequency, high sidebands will be produced outside the band. Frequencies of these sidebands may fall back into the band and occur as "alias signals." Once in the band, the noise caused by these alias signals cannot be eliminated by subsequent filtering.

It is well known to modulate a carrier signal by splitting the modulating signal into its low-frequency and high-frequency components. For instance, in U.S. Pat. No. 3,868,599 entitled "SINGLE SIDEBAND FREQUENCY MODULATION SYSTEM" and issued to Takashi Hiraski and Gojiro Suga on Feb. 25, 1975, a modulating signal is split into its low-frequency and high-frequency components by low-pass and high-pass filters, respectively. The output of the high-pass filter is phase-shifted, integrated and applied to an exponential function generator. The output of the high-pass filter is also combined with the low-frequency component and frequency modulated by a conventional frequency modulator. The respective outputs of the exponential function generator and frequency modulator are combined in an amplitude modulator. Thus, by removing the low-frequency component from the exponential function generator, the range of outputs of the exponential function generator remains relatively stable and, therefore, the exponential generator does not become saturated. However, since the high-frequency component of the modulating signal is used to modulate the carrier signal by conventional means, the alias signals still occur in the band.

One example of apparatus for reducing the noise caused by alias signals is disclosed in U.S. Pat. No. 4,802,016 entitled "VIDEO NOISE REDUCTION SYSTEM WITH SIGNAL EMPHASIS PRECEDING FM MODULATION UPPER-BAND LUMINANCE" and issued to Shinji Kaneko on Jan. 31, 1989. Prior to FM modulation, a luminance signal is split into its high-frequency and low-frequency components. The low-level components of the high-frequency luminance signal are emphasized by an emphasis circuit and are then added to the low frequency luminance signal by an adder. The output of the adder is then frequency modulated by conventional means.

Therefore, it is an object of the present invention to provide a frequency modulation system that provides a modulated signal which is free of alias signals.

It is a further object of the present invention to provide a digital frequency modulator that splits a modulating signal into its high-frequency and low-frequency components, modulates the low-frequency component by conventional means, narrow-band modulates the high-frequency component, and then adds the modulated components together.

SUMMARY OF THE INVENTION

The present invention modulates a carrier frequency with a modulating signal by splitting the modulating signal into high and low frequency components. A first adding means adds the frequency of the carrier signal to the frequency of the modulating signal. Determining means, responsive to an output of the first adding means determines the phase angles of the low frequency and high frequency components of the output of the adding means. Sine means, responsive to a first output of the determining means, provides a wideband modulated signal. Cosine means, responsive to the first output of the determining means, provides the cosine of the phase angle of the low frequency component, and multiplying means, responsive to a second output of the determining means and to an output of the cosine means, multiplies the phase angle of the high frequency component by the cosine of the phase angle of the low-frequency component, thus providing a narrow-band modulated signal. Second adding means, responsive to respective outputs of said sine means and said multiplying means, adds the narrowband and wideband modulated signals together to provide the frequency modulated signal.

DETAILED DESCRIPTION OF THE EXEMPLARY EMBODIMENTS

Figure 1:
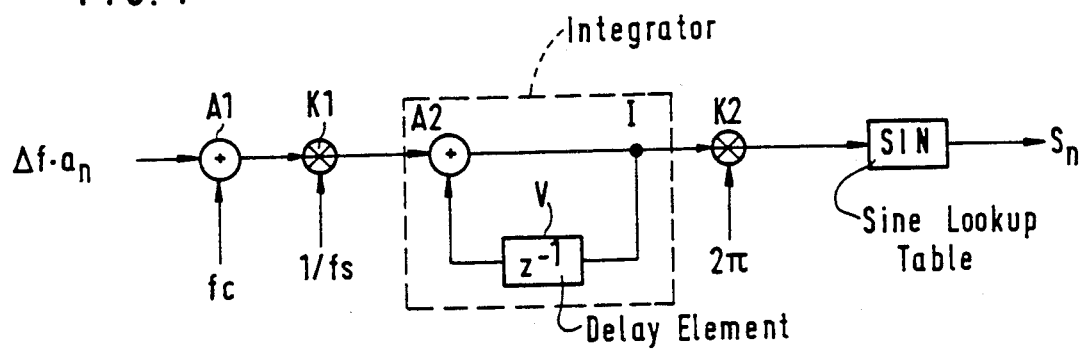
FIG. 1 is a block diagram of a prior art digital FM modulator.

Referring to FIG. 1, there is shown a block diagram of a conventional prior art FM modulator in which both high and low frequency components of a modulating signal are used to modulate a carrier signal in a conventional manner. A first input of a first adder A1 is fed with carrier frequency fc and a second input of the first adder A1 is fed with a modulating frequency $\Delta f \cdot a_n$, where $\Delta f$ = frequency deviation, and $a_n$ = the low frequency component of the modulating signal. The output of the first adder A1 is multiplied by a coefficient 1/fs in a multiplier K1, where fs = sampling frequency. The output of the multiplier K1 is fed to an integrator I, which comprises a second adder A2 and a delay element V. The output of multiplier K1 is coupled to a first input of the second adder A2. The delay element V is connected between the output of the second adder A2 and a second input of the second adder A2. The output of the second adder A2, which also provides the output of the integrator I, is multiplied by a coefficient $2\pi$ in a second multiplier K2, whose output is fed to the input of a sine table SIN. The output of the sine table SIN represents the frequency modulated signal $S_n$. In practice, the coefficient $2\pi$ may be included in the sine table SIN, thus eliminating the need for the second multiplier K2. Without the scaling coefficient 1/fs, the accumulation in the integrator I would be dependent on the respective sampling frequency fs. If a fixed sampling frequency fs is used, the multiplier K1 can be replaced by predetermining the storage space of the delay element V.

Thus described, the modulating signal contains only a low frequency component $a_n$. If, however, the modulating signal contains a high-frequency component as well as a low-frequency component $a_n$, the frequency modulator shown in FIG. 1 will produce side bands in the frequency modulated signal $S_n$. The side bands originate from the modulation processing of the high-frequency component of the modulating signal and fall back into the band, where they appear as alias signals.

The problem arising from the high frequency component is overcome by the present invention. Before describing the exemplary embodiments of the present invention, however, the operation of the present invention will be explained mathematically. First, the FM modulation of an analog, time-continuous signal f(t) will be considered. Then, the FM modulation of a discrete signal $f_n$ will be considered. The variables to be used have the following meanings:

S(t) = frequency of the output signal;
fc = frequency of the carrier signal;
$w_c$ = angular frequency of the carrier signal;
$\Delta f$ = frequency deviation;
$\alpha$ = angular frequency deviation ($2\pi \Delta f$);
fs = sampling frequency;
f(t) = the modulating signal;
a(t) = low frequency component of the modulating signal f(t);
b(t) = high frequency component of the modulating signal f(t); and
$\theta(t)$ = phase angle of the FM output signal.

For the FM modulation of an analog, time-continuous signal f(t), the FM output signal y(t) is expressed as $$S(t) = \sin[\Theta(t)] \qquad (1)$$

where $$\Theta(t) = w_c t + \alpha \int f(t) dt \qquad (2)$$

Assuming that the modulating signal has both a low-frequency component and a high frequency component, then $$f(t) = a(t) + b(t) \qquad (3)$$

Thus, equation (2) can be expressed as $$\Theta(t) = w_c t + \alpha \int a(t) dt + \alpha \int b(t) dt \qquad (4)$$

Simplifying the two integrals in equation (4) and then substituting equation (4) into equation (1) yields $$S(t) = \sin[w_c t + \alpha \cdot x(t) + \alpha \cdot y(t)]$$

or $$S(t) = \sin[w_c t + \alpha \cdot x(t)] \cdot \cos[\alpha \cdot y(t)] + \cos[w_c t + \alpha \cdot x(t)] \cdot \sin[\alpha \cdot y(t)] \qquad (5)$$

When the phase angle of the high-frequency component y(t) is small, such that $$|\alpha \cdot y(t)| << \pi/2 \qquad (6)$$

then $\cos[\alpha \cdot y(t)] = 1$ and $\sin[\alpha \cdot y(t)] = \alpha \cdot y(t)$. Thus, equation (5) can be simplified as $$S(t) = \sin[w_c t + \alpha \cdot x(t)] + \alpha \cdot y(t) \cdot \cos[w_c t + \alpha \cdot x(t)] \qquad (7)$$

or $$S(t) = \sin[\Theta_1(t)] + \alpha \cdot y(t) \cdot \cos[\Theta_1(t)] \qquad (8)$$

where $$\begin{aligned}
\Theta_1(t) &= w_c t + \alpha \cdot x(t) \\
&= w_c t + \alpha \int a(t) dt \\
&= \int [w_c + \alpha \cdot a(t)] dt \\
&= \int [w_c + 2\pi \Delta f \cdot a(t)] dt
\end{aligned}$$

The first term in equation (8), $\sin[\Theta_1(t)]$, corresponds to a signal modulated by the low-frequency component a(t). Thus, the first term in equation (8) corresponds to an output signal that is subjected to normal "wideband FM" processing. In contrast, the second term in equation (8), $\alpha \cdot y(t) \cdot \cos[w_c t + \alpha x(t)]$, corresponds to an output signal that is modulated, in part, by the high-frequency component b(t) and that is, therefore, subjected to "narrow-band FM" processing.

For the FM modulation of a discrete signal $f_n$, the following relationship holds true:

$$1/s = 1/fs \cdot 1/(1 - z^{-1}) \text{ for } |w| << 2\pi fs \qquad (9)$$

Thus, in the Z-domain, the phase angle $\Theta_1(z)$ is $$\begin{aligned}
\Theta_1(z) &= 1/fs \cdot 1/1 - z^{-1} \cdot z\{w_c + \alpha \cdot a(n)\} \\
&= 2\pi/fs \cdot 1/1 - z^{-1} \cdot z\{fc + \Delta f \cdot a(n)\}
\end{aligned} \qquad (10)$$

Equation (10) expresses the phase angle of a time-discrete FM output signal if only the low-frequency component is present in the modulating signal $f_n$. Therefore, the first term in equation (8) can be processed by the prior art frequency modulation system illustrated in FIG. 1.

Figure 5:
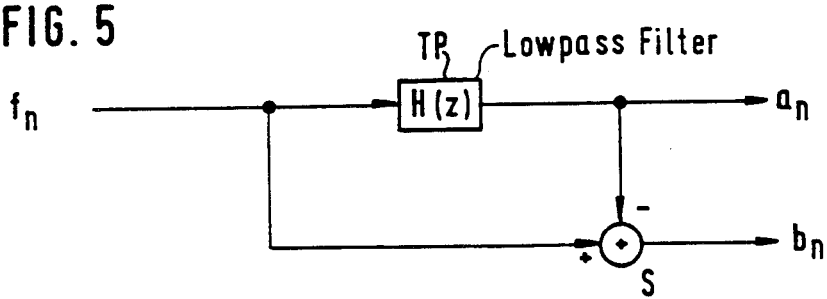
FIG. 5 is a block diagram of a bandsplitter that splits a modulating signal into a low-frequency component

Now, it will be shown that the relationship of equation (6) can be satisfied if discrete signals are modulated. The modulating signal $f_n$ is separated into a low-frequency component $a_n$ and a high-frequency component $b_n$ by low-pass filter TP and a subtracter S (see FIG. 5). The z-transforms of the low-frequency and high-frequency components are:

$$A(z) = H(z) \cdot F(z) \quad (11)$$

$$B(z) = \{1 - H(z)\} \cdot F(Z) \quad (12)$$

where $H(z)$ is the transfer function of the low-pass filter TP in the z-plane. For time-discrete signals, the z-transforms of the second and third terms of equation (5) become $$X(z) = 1/fs \cdot 1/(1 - z^{-1}) \cdot H(z) \cdot F(z) \quad (13)$$

and $$Y(z) = 1/fs \cdot 1/(1 - z^{-1}) \cdot (1 - H(z)) \cdot F(z) \quad (14)$$

If the transfer function of the low pass filter TP has the response $H(z) = \frac{1}{2}(1 + z^{-1})$, then $$X(z) = \frac{1}{2}fs \cdot (1 + z^{-1}) / (1 - z^{-1}) \cdot F(z) \quad (15)$$

and $$Y(z) = \frac{1}{2}fs \cdot F(z) \quad (16)$$

Transforming equation (16) from the z-plane into the time-discrete representation gives $$\begin{aligned} a \cdot y_n &= \frac{\alpha}{2fs} \cdot f_n \\ &= \frac{2\pi \Delta f}{2fs} \cdot f_n \\ &= \pi \cdot \frac{\Delta f}{fs} \cdot f(n) \end{aligned} \quad (17)$$

For $$|f_n| \leq 1$$

we obtain $$|a \cdot y(n)| \leq \pi \cdot \frac{\Delta f}{fs} \quad (18)$$

Standard values for video recorders are as follows:

$fs = 20.25 MHz$ $f_c = 4.3 MHz$ $\Delta f = 9.5 MHz$

Substituting these values into relation (18) gives $$|a \cdot y(n)| \leq \pi \cdot \frac{0.5}{20.25} = 0.08 < < \frac{\pi}{2} \quad (19)$$

Thus, by suitable choice of the transfer function $H(z)$, relation (6) can be satisfied if the signals are processed in time-discrete form. The only requirement for the transfer function $H(z)$ is that $a_n$ does not contain any appreciable high-frequency components.

Figure 2:
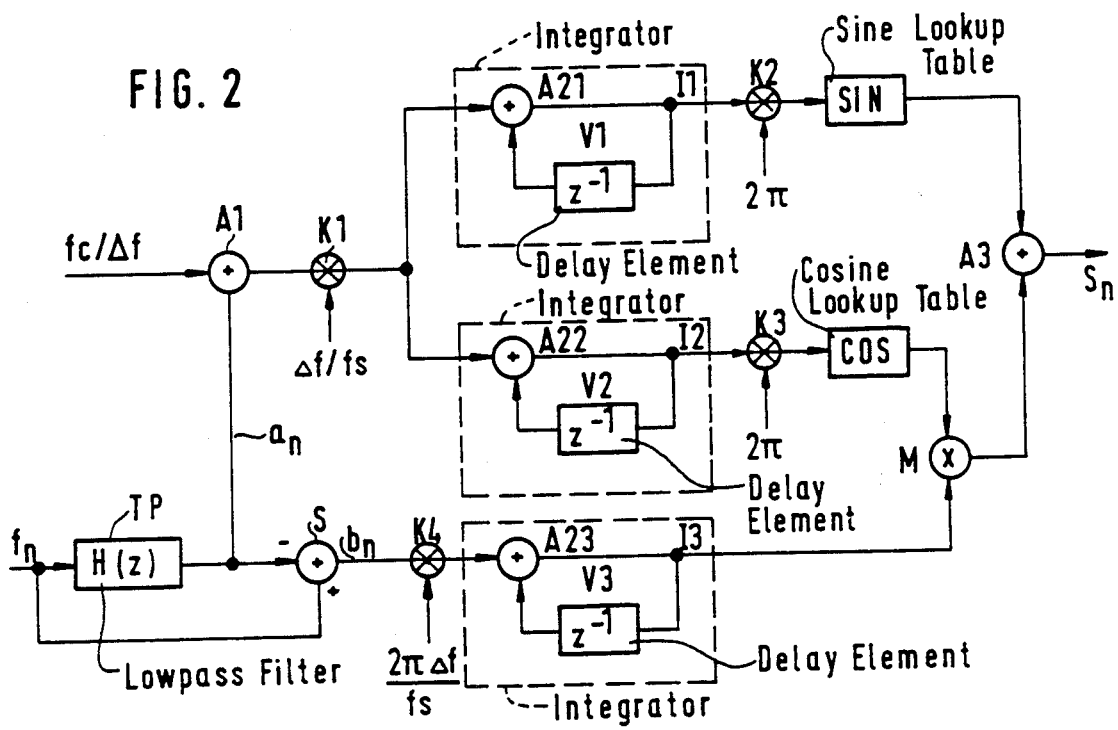
FIG. 2 is a block diagram of a first embodiment of a digital FM modulator in accordance with the present invention.

Referring now to FIG. 2, a block diagram of a first embodiment of the present invention is shown. The digital FM modulator includes a low-pass filter TP, whose input is fed with the modulating signal $f_n$. The output of the low-pass filter TP provides the low-frequency component of the modulating signal $f_n$ according to the transfer function $H(z)$. The modulating signal $f_n$ is also applied to the add input (+) of a subtracter S, and the output of the low-pass filter TP is applied to the subtract input (−). The output of the subtractor S provides the high-frequency component $b_n$ of the modulating signal $f_n$.

The output of the low-pass filter TP, which output is the low-frequency component $a_n$ of the modulating signal $f_n$, is coupled to a first input of a first adder A1, and the carrier frequency, indicated in normalized form by fc/$\Delta$f, is fed to a second input of the adder A1. The output of the adder A1 is multiplied by a coefficient $\Delta f/fs$ in a first multiplier K1, whose output is applied to the inputs of first and second integrators I1 and I2, respectively. The first and second integrators I1 and I2 which contain adders A21 and A22, respectively, and delay elements V1 and V2, respectively, function in the same manner as the integrator I illustrated in FIG. 1. The output signals of the first and second integrators I1 and I2 are approximately sawtooth-shaped. The two integrators accumulate the input signal in their respective delay elements V1 and V2 and then, due to overflow, cause their respective delay elements V1 and V2 to begin at small numerical values again. Thus, the integrators I1 and I2 use modulo arithmetic to output a phase angle $\Theta_1$ for values $0 \leq \Theta_1 \leq 2\pi$. The output of the first integrator I1 is multiplied by $2\pi$ by a second multiplier K2. The output signal from the second multiplier K2 is then applied to a sine lookup table SIN. For instance, the sine lookup table SIN can be a read only memory (ROM), in which input signals from the second multiplier K2, which correspond to phase angles $\Theta_1$ result in output signals corresponding to $\sin(\Theta_1)$. Such ROM lookup tables are well known to the art. Thus, the output of the sine lookup table SIN corresponds to the first term of equation (8), which is the carrier signal frequency modulated by the low-frequency component $a_n$ of input signal $f_n$.

Processing of the second term of equation (8), which is the narrowband frequency modulated signal, is as follows. The output of the second integrator I2 is multiplied by $2\pi$ by a third multiplier K3, whose output signal is applied to a cosine lookup table COS. The output of the subtractor S is multiplied by the coefficient ($2\pi\Delta f/fs$) in a fourth multiplier K4, whose output is applied to the input of a third integrator I3, which contains adder A23 and delay element V3. The third integrator I3, unlike the first and second integrators I1 and I2, has no overflow. Thus, it acts as a genuine integrator and provides a continuous output signal. The output of the cosine table COS and the output of the third integrator I3 are each applied to respective inputs of a fifth multiplier M. The output of the fifth multiplier M provides the second term in equation (8). The output of the multiplier M and the output of the sine table SIN are then applied to respective inputs of a third adder A3, to combine the modulated component signals. The output of the adder A3 provides the frequency modulated signal $S_n$.

Figure 3:
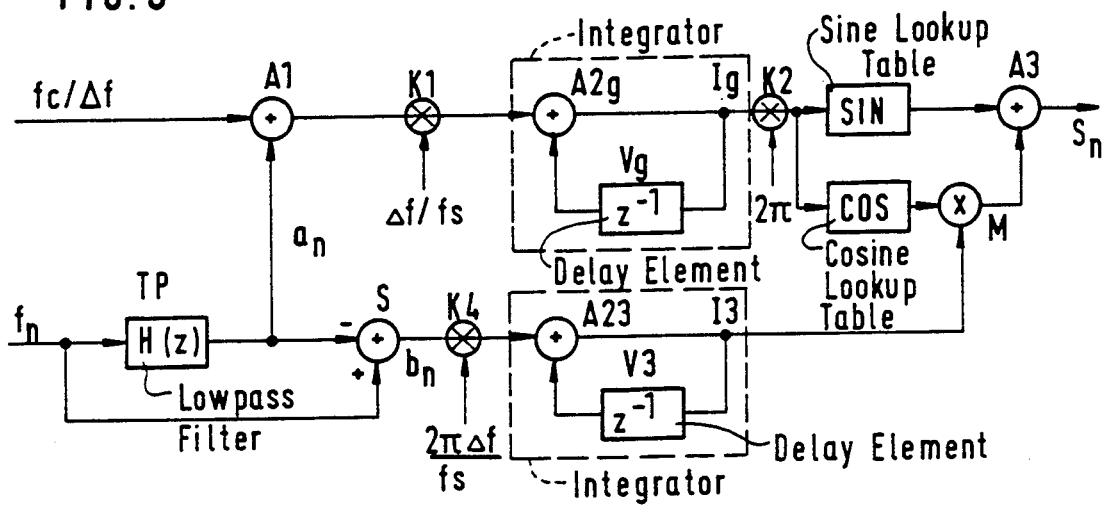
FIG. 3 is a block diagram of a second embodiment of a digital FM modulator in accordance with the present invention.

Referring now to FIG. 3, there is shown a second embodiment of the present invention. The only difference between the first and second embodiments is that the first and second integrators I1 and I2 are replaced by a common integrator Ig, whose sawtooth-shaped output signal is fed to a single multiplier K2. The output of the single multiplier K2 is applied to both the sine and cosine lookup tables SIN and COS. The common integrator Ig contains a second adder A2g and a common delay element Vg. Otherwise, the second embodiment shown in FIG. 3 corresponds to the first embodiment shown in FIG. 2.

Figure 4:
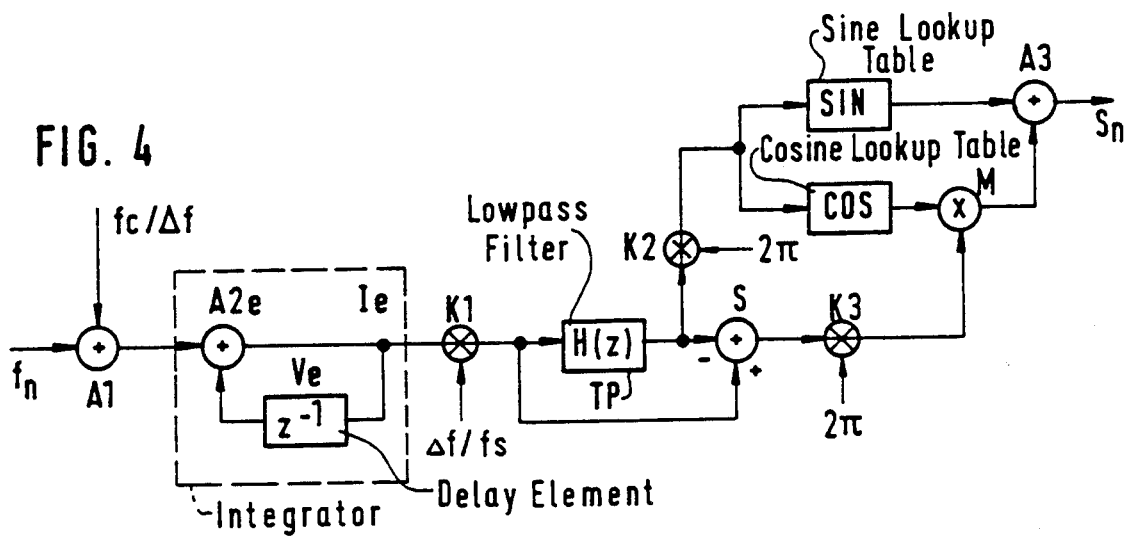
FIG. 4 is a block diagram of a third embodiment of a digital FM modulator in accordance with the present invention.

Referring now to FIG. 4, yet another embodiment of the present invention is shown. The embodiment shown in FIG. 4 uses only a single integrator Ie, which contains a second adder A2e and a delay element Ve. Here, the integrator Ie is connected ahead of the low-pass filter TP. Thus, the formation of the sawtooth waveform by the integrator Ie is carried out under the influence of both the low-frequency and high-frequency components $a_n$ and $b_n$ of the modulating signal $f_n$. The output of the integrator Ie is multiplied by $\Delta f/fs$ by a first multiplier K1, whose output is split into low-frequency and high-frequency components by the low-pass filter TP, which has the transfer function H(Z). After being multiplied by the coefficient $2\pi$ by the second multiplier K2, the low-frequency component is fed to both the sine and cosine tables SIN and COS. The high-frequency component is multiplied by the coefficient $2\pi$ by a third multiplier K3, and the outputs of the cosine table and the first multiplier K1 are multiplied by another multiplier M. Finally, the outputs of multiplier M and sine table SIN are added by adder A3, whose output provides the frequency modulated signal $S_n$.

It will be understood that the embodiments described herein are merely exemplary and that a person skilled in the art may make many variations and modifications without departing from the spirit and scope of the invention. All such modifications are intended to be included within the scope of the invention as defined in the appended claims.

What is claimed is:

1. A system for modulating a carrier signal with a modulating signal, comprising:
   first adding means for adding the frequency of said carrier signal to the frequency of said modulating signal;
   determining means, responsive to an output of said first adding means, for determining the phase angles of the low-frequency and high-frequency components of said output of said adding means;
   sine means, responsive to a first output of said determining means, for determining the sine of the phase angle of said low-frequency component;
   cosine means, responsive to said first output of said determining means, for determining the cosine of the phase angle of said low-frequency component;
   multiplying means, responsive to a second output of said determining means and to an output of said cosine means, for multiplying the phase angle of said high-frequency component by the cosine of said phase angle of said low-frequency component; and
   second adding means, responsive to respective outputs of said sine means and said multiplying means, for adding said outputs of said sine means and said multiplying means.

2. A system according to claim 1, wherein said determining means includes phase angle means for providing a phase angle corresponding to said output of said first adding means; and bandsplitting means, responsive to said output of said phase angle means, for splitting said output of said phase angle means into said low-frequency component and said high-frequency component.

3. A system according to claim 2, wherein said phase angle means includes integrator means for providing a sawtooth signal that changes to a minimum value after reaching a maximum value, and that has a slope proportional to the combined frequencies of said carrier and said modulating signal.

4. A system according to claim 2, wherein said bandsplitting means includes lowpass filter means for providing said low frequency component of said modulating signal; and highpass filter means for providing said high-frequency component of said modulating signal.

5. A system according to claim 1, wherein said determining means includes bandsplitting means, responsive to said output of said first adding means, for splitting said output of said first adding means into said low-frequency component and said high-frequency component; first phase angle means, responsive to a first output of said bandsplitting means, for providing a phase angle of said low frequency component; and second phase angle means, responsive to a second output of said bandsplitting means, for providing a phase angle of said high frequency component.

6. A system according to claim 5, wherein said second phase angle means includes integrator means for integrating said high-frequency component over time.

7. A system according to claim 5, wherein said first phase angle means includes integrator means for providing a sawtooth signal that changes to a minimum value after reaching a maximum value, and that has a slope proportional to said added frequencies of said carrier and said modulating signal, an output of said integrator means providing said first output of said determining means.

8. A system according to claim 5, wherein said first phase angle means includes first integrator means for providing said low frequency component to said sine means; and second integrator means for providing said high frequency component to said cosine means; said first and second integrator means each providing a sawtooth signal that changes to a minimum value after reaching a maximum value, and that has a slope proportional to said added frequencies of said carrier and said modulating signal.

9. A system according to claim 5, wherein said bandsplitting means includes lowpass filter means for providing said low frequency component of said modulating signal; and highpass filter means for providing said high-frequency component of said modulating signal.

10. A system according to claim 1, wherein said modulating signal and said carrier signal are binary-coded signals.

11. A system according to claim 10, wherein a modulated signal is provided by said system according to the equation:

$$S_n = \sin(\Theta_1) + a \cdot y_n \cdot \cos(\Theta_1)$$

where $S_n$ is the modulated signal, and $\Theta_1$ and $\alpha \cdot y_n$ are the phase angles of said low frequency and high frequency components, respectively.

12. A system according to claim 1, wherein said sine means and said cosine means are read-only-memory lookup tables.

13. A system for modulating a carrier signal with a modulating signal, comprising:

bandsplitting means for splitting said modulating signal into a low-frequency component and a high-frequency component, said low-frequency and high-frequency components being provided on first and second outputs, respectively;

first modulating means, responsive to a first output of said bandsplitting means, for modulating said carrier signal with said low frequency component;

second modulating means for narrow-band modulating said carrier signal with said high frequency component, including:

cosine means, responsive to said first output of said bandsplitting means, for determining the cosine of the phase angle of said low frequency component;

phase angle means, responsive to a second output of said bandsplitting means, for determining the phase angle of said high-frequency component; and multiplying means for multiplying the outputs of said cosine means and said phase angle means;

adding means, responsive to respective outputs of said first modulating means and said multiplying means, for adding together said outputs of said first modulating means and said multiplying means.

14. A system according to claim 13, wherein said phase angle means includes a first integrator, and wherein said cosine means includes a second integrator for determining the phase angle of said low frequency component and cosine generator means, responsive to an output of said second integrator means, for generating the cosine of the phase angle of said low frequency component.

15. A system according to claim 14, wherein said first modulating means includes sine generator means, responsive to an output of said second integrator, for providing the sine of the phase angle of said low frequency component.

16. A system according to claim 14, wherein said first modulating means includes a third integrator for determining the phase angle of said low frequency component, and sine generator means, responsive to an output of said third integrator, for providing the sine of said phase angle of said low frequency component.

17. A system according to claim 16, wherein each one of said integrators provides a sawtooth signal that changes to a minimum value after reaching a maximum value, and that has a slope proportional to said added frequencies of said carrier and said modulating signal.

18. A system according to claim 17, wherein said sine generator means includes a first read-only memory lookup table, and wherein said cosine generator means includes a second read-only memory lookup table.

19. A system according to claim 13, wherein said bandsplitter means includes lowpass filter means for providing the low frequency component of said modulating signal; and highpass filter means for providing said high-frequency component of said modulating signal.

20. A system according to claim 19, wherein said lowpass filter means includes a lowpass filter, and wherein said highpass filter means includes subtractor means for subtracting said low-frequency component from said modulating signal, said subtractor means having inputs adapted to receive said modulating signal and said output of said lowpass filter.

21. A system according to claim 20, wherein said lowpass filter has a response H(z) in the z-domain of $$H(z) = \tfrac{1}{2}(1 + z^{-1}).$$

22. A system according to claim 13, wherein said modulating signal and said carrier signal are binary-coded signals.

23. A system according to claim 22, wherein a modulated signal is provided by said system according to the equation:

$$S_n = \sin(\Theta_1) + \alpha \cdot y_n \cdot \cos(\Theta_1)$$

where $S_n$ is the modulated signal, and $\Theta_1$ and $\alpha \cdot y_n$ are the phase angles of said low frequency and high frequency components, respectively.

* * * * *